(12) United States Patent
Qian et al.

(10) Patent No.: US 7,811,915 B2
(45) Date of Patent: Oct. 12, 2010

(54) METHOD FOR FORMING BIT LINES FOR SEMICONDUCTOR DEVICES

(75) Inventors: Weidong Qian, Sunnyvale, CA (US);
Mark T. Ramsbey, Sunnyvale, CA (US); Tazrien Kamal, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/048,549

(22) Filed: Mar. 14, 2008

(65) Prior Publication Data
US 2008/0157187 A1    Jul. 3, 2008

Related U.S. Application Data

(62) Division of application No. 11/380,971, filed on May 1, 2006, now abandoned.

(51) Int. Cl.
*H01L 21/22* (2006.01)

(52) U.S. Cl. .................. 438/546; 438/288; 438/519; 438/545; 438/555; 257/324; 257/E21.657

(58) Field of Classification Search .............. 438/288, 438/519, 545, 546, 555; 257/314, 315, 324, 257/E21.656, E21.657
See application file for complete search history.

(56) References Cited

U.S. PATENT DOCUMENTS

| 5,635,415 | A | * | 6/1997 | Hong | 438/261 |
| 6,248,635 | B1 | * | 6/2001 | Foote et al. | 438/287 |
| 6,723,649 | B2 | * | 4/2004 | Chang et al. | 438/694 |
| 6,958,272 | B2 | * | 10/2005 | Lingunis et al. | 438/257 |
| 6,987,048 | B1 | * | 1/2006 | Cheng et al. | 438/262 |
| 7,176,113 | B1 | | 2/2007 | Wong et al. | 438/526 |
| 7,408,222 | B2 | * | 8/2008 | Hagenbeck et al. | 257/327 |
| 2002/0151138 | A1 | * | 10/2002 | Liu | 438/261 |
| 2003/0067032 | A1 | | 4/2003 | Caprara et al. | 257/324 |
| 2003/0104670 | A1 | * | 6/2003 | Wu | 438/257 |
| 2004/0108540 | A1 | * | 6/2004 | Yoshino | 257/315 |
| 2004/0110344 | A1 | * | 6/2004 | Huang et al. | 438/257 |
| 2006/0014348 | A1 | | 1/2006 | Wu | 438/262 |

OTHER PUBLICATIONS

U.S. Appl. No. 11/380,971, by Weidong Qian et al., entitled "Bit Lines for Semiconductor Devices", filed May 1, 2006; 30 pages.

* cited by examiner

*Primary Examiner*—Kiesha R Bryant
*Assistant Examiner*—Mark W Tornow
(74) *Attorney, Agent, or Firm*—Harrity & Harrity, LLP

(57) ABSTRACT

A method for forming a semiconductor device includes forming a first dielectric layer over a first portion of a substrate, forming a charge storage layer over the first dielectric layer and etching a trench in the charge storage layer and the first dielectric layer, where the trench extends to the substrate. The method also includes implanting n-type impurities into the substrate to form an n-type region having a first depth and a first width and implanting p-type impurities into the substrate after implanting the n-type impurities, the p-type impurities forming a p-type region having a second depth and a second width. The method further includes forming a second dielectric layer over the charge storage layer and forming a control gate over the second dielectric layer.

16 Claims, 12 Drawing Sheets

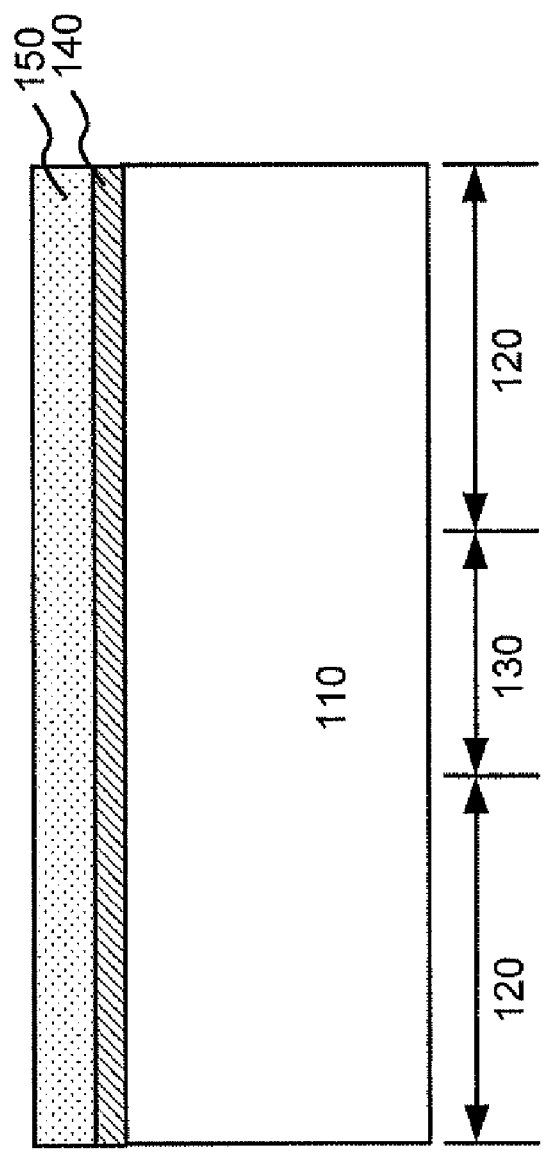

METHOD FOR FORMING BIT LINES FOR SEMICONDUCTOR DEVICES

RELATED APPLICATION

This application is a divisional of U.S. patent application Ser. No. 11/380,971 filed, May 1, 2006, the disclosure of which is hereby incorporated herein by reference.

TECHNICAL FIELD

The present invention relates generally to semiconductor devices and methods of manufacturing semiconductor devices. The invention has particular applicability to memory devices and to the formation of bit lines.

BACKGROUND ART

The escalating demands for high density and performance associated with non-volatile memory devices, such as electrically erasable programmable read only memory (EEPROM) devices, require small design features, high reliability and increased manufacturing throughput. The reduction of design features, however, challenges the limitations of conventional methodology.

One particular problem with scaling memory devices to reduce their size is that the memory devices often exhibit degraded performance. For example, reducing the size of various conductive structures in the memory devices, such as bit lines, often results in increased resistance associated with the bit lines. This increased resistance may require an increase in the voltage to program and/or erase the memory cells in the memory device, which may cause additional problems. These problems may make it difficult for the memory device to be efficiently programmed and/or erased and, ultimately, may lead to device failure.

DISCLOSURE OF THE INVENTION

Advantages and features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one aspect consistent with the invention, a method for forming a memory device is provided. The method includes forming a first dielectric layer over a first portion of a substrate, forming a charge storage layer over the first dielectric layer and etching a trench in the charge storage layer and the first dielectric layer, the trench extending to the substrate. The method also includes implanting n-type impurities into the substrate to form an n-type region having a first depth and a first width and implanting p-type impurities into the substrate after implanting the n-type impurities, the p-type impurities forming a p-type region having a second depth and a second width, wherein the second depth is greater than the first depth and the second width is greater than the first width. The method further includes forming a second dielectric layer over the charge storage layer, the second dielectric layer filling a portion of the trench and forming a control gate over the second dielectric layer.

According to another aspect consistent with the invention, a method is provided. The method includes forming a first dielectric layer over a first portion of a substrate, forming a charge storage layer over the first dielectric layer and etching a trench through the charge storage layer and the first dielectric layer to the substrate. The method also includes implanting n-type impurities into the substrate to form an n-type region having a first depth and a first width and implanting p-type impurities into the substrate after implanting the n-type impurities, the p-type impurities forming a p-type region having a second depth and a second width. The method further includes forming a second dielectric layer over the charge storage layer and forming a control gate over the second dielectric layer.

According to a further aspect consistent with the invention, a method is provided. The method includes forming a plurality of memory cells and forming a plurality of bit lines, each of the bit lines acting as a source region or drain region for a portion of the plurality of memory cells. The forming a plurality of bit lines comprises forming a plurality of n-type impurity regions, each n-type impurity region having a first width and being formed to a first depth below an upper surface of a substrate and forming a plurality of p-type impurity regions after the plurality of n-type impurity regions have been formed, each p-type impurity region having a second width and being formed to a second depth below the upper surface of the substrate, the second width being greater than the first width and the second depth being greater than the first depth.

Other advantages and features of the invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIGS. 1A-1C are cross-sections illustrating the formation of memory cell regions and a bit line region in a semiconductor device in accordance with an embodiment of the invention.

BEST MODE FOR CARRYING OUT THE INVENTION

Figure 1A:
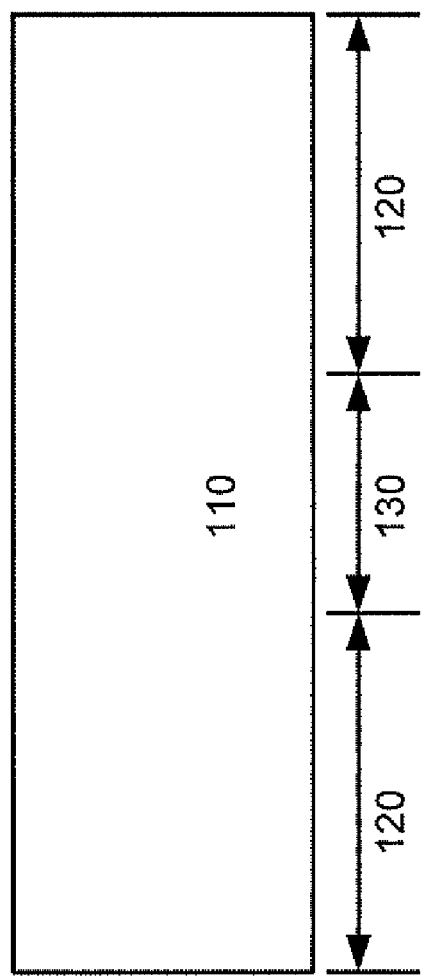

FIG. 1A is a cross-section illustrating the formation of memory cell regions and a bit line region in a semiconductor device in accordance with an embodiment of the invention. Referring to FIG. 1A, semiconductor device 100 may include layer 110 divided into memory cell regions 120 and a bit line region 130. In an exemplary embodiment, layer 110 may be a substrate of semiconductor device 100 and may include silicon (e.g., polycrystalline silicon), germanium, silicon-germanium or other semiconducting materials. In alternative implementations, layer 110 may be a semiconducting layer formed a number of layers above the surface of a substrate of semiconductor device 100. Only two memory cell regions 120 and a single bit line region 130 are shown in FIG. 1A for simplicity. It should be understood that semiconductor device 100 may include a large number of memory cell regions 120 and bit line regions 130. One or more isolation regions, such as shallow trench isolation regions (not shown) may also be formed in substrate 110 to isolate various active regions of semiconductor device 100.

FIG. 1B illustrates the formation of exemplary layers formed on semiconductor device 100 in accordance with an exemplary embodiment. Referring to FIG. 1B, layer 140 may be a dielectric layer formed on substrate 110 in a conventional manner. In an exemplary implementation, dielectric layer 140 may include an oxide, such as a silicon oxide (e.g., $SiO_2$), and may have a thickness ranging from about 40 angstroms (Å) to about 80 Å. Dielectric layer 140 may function as a tunnel oxide layer for one or more subsequently formed memory cells of semiconductor device 100.

Layer 150 may be formed on layer 140 in a conventional manner and may include a dielectric material, such as a nitride (e.g. a silicon nitride). Layer 150, consistent with the invention, may act as a charge storage layer for semiconductor device 100 and may have a thickness ranging from about 70 Å to about 120 Å.

Figure 1C:
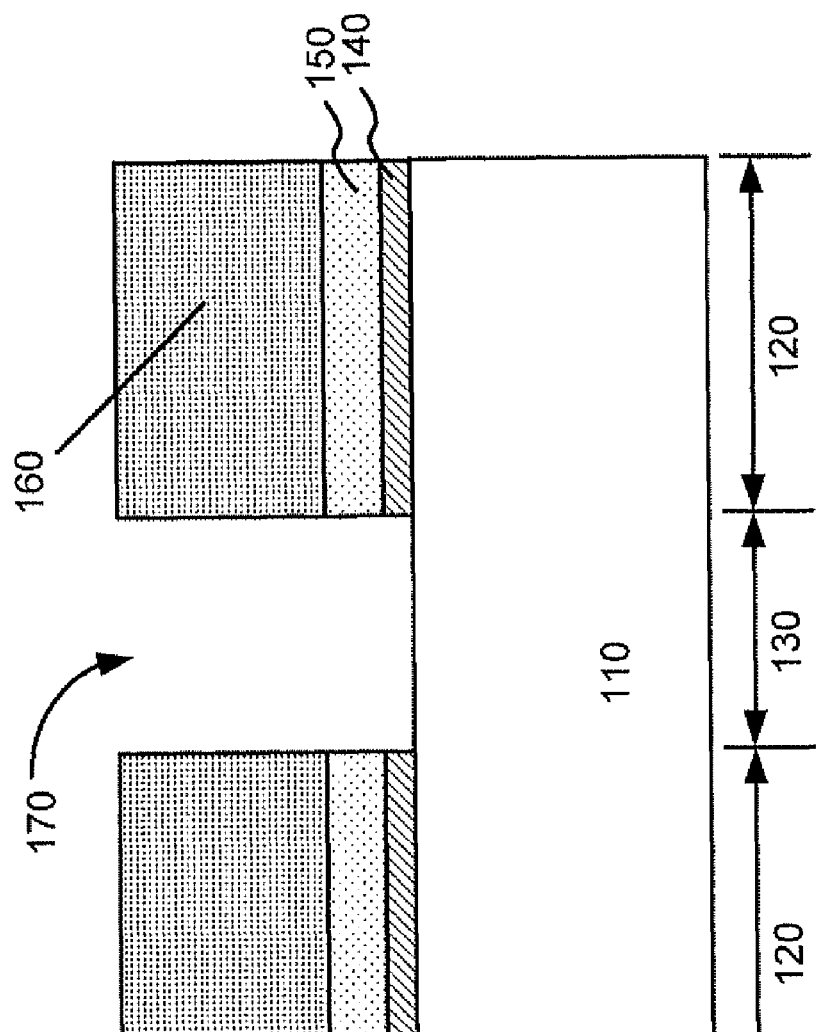

Masks 160 may be formed over portions of layer 150, as illustrated in FIG. 1C. For example, masks 160 may be formed over layer 150 in memory cell regions 120. The portions of layers 140 and 150 not covered by masks 160 may then be etched down to substrate 110, leaving an opening 170 over bit line region 130, as illustrated in FIG. 1C. Masks 160 may be used to facilitate formation of a bit line that is coupled to a number of memory cells, such as a column of memory cells in a memory cell array. The width of opening 170 may vary based on the particular circuit requirements. In an exemplary implementation, the width of opening 170 may range from about 600 Å to about 1200 Å.

Figure 2:
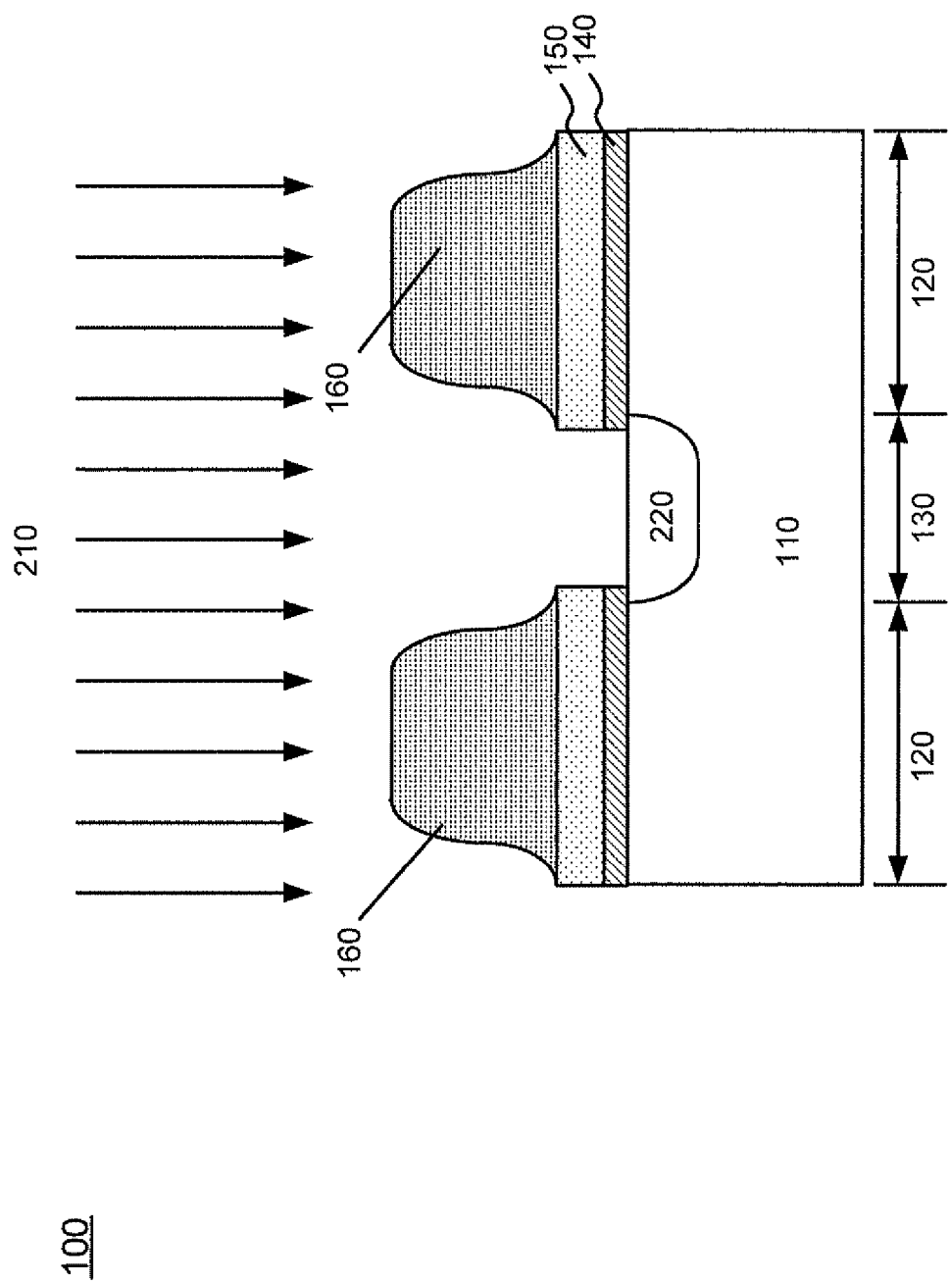
FIG. 2 is a cross-section illustrating an ion implantation process used to form a portion of a bit line in accordance with an embodiment of the invention.

An ion implantation process may then be performed as illustrated in FIG. 2. For example, n-type impurities, such as arsenic or phosphorous, may be implanted in semiconductor device 100 using a vertical implantation (i.e., no tilt angle with respect to the upper surface of substrate 110), as illustrated by arrows 210 in FIG. 2, to form n-type region 220. In an exemplary implementation, n-type region 220 may be formed to a depth ranging from about 200 Å to about 400 Å below the upper surface of substrate 110 and a width ranging from about 1100 Å to about 1700 Å. Masks 160 may shield memory cell regions 120 from the implantation forming n-type region 220.

In an exemplary implementation, the n-type impurities implanted to form region 220 may be implanted using a relatively high dosage, high energy implantation process. For example, arsenic may be implanted at a dosage ranging from about $0.75 \times 10^{15}$ atoms/cm$^2$ to about $1.5 \times 10^{15}$ atoms/cm$^2$ and an implantation energy ranging from about 30 kiloelectron volts (KeV) to about 40 KeV. In alternative implementations, phosphorous or other n-type impurities may be implanted at similar dosages and energies to form n-type region 220.

During this relatively high dosage, high energy vertical implantation process, it has been found that masks 160 may shrink, as illustrated in FIG. 2. For example, a portion of the corners and sides of masks 160 may be etched away as a result of the implantation process. In this case, the width of region 220 may be wider than the width of opening 170. That is, a portion of the n-type impurities may extend into substrate 110 below areas where masks 160 have been etched away.

Another ion implantation process may then be performed to form another portion of the bit line. For example, p-type impurities, such as boron, may be implanted in semiconductor device 100, as illustrated by arrows 310 in FIG. 3A. In an exemplary implementation, boron may be implanted at a dosage ranging from about $3 \times 10^{13}$ atoms/cm$^2$ to about $1.2 \times 10^{14}$ atoms/cm$^2$ and an implantation energy ranging from about 15 KeV to about 30 KeV. The boron may also be implanted using a tilt angle ranging from about 10 degrees to 20 degrees with respect to the upper surface of substrate 110.

During this ion implantation, the p-type impurities may be implanted into substrate 110 to a depth ranging from about 300 Å to about 1000 Å below the upper surface of substrate 110. As a result, the p-type impurities are implanted to a depth below n-type region 220. For example, the p-type impurities may be implanted to a depth ranging from about 100 Å to about 800 Å below the lower surface of n-type region 220, as indicated by the dashed line in FIG. 3A. As further illustrated in FIG. 3A, the left mask 160 prevents the p-type impurities from reaching the left side of bit line region 130.

Figure 3A:
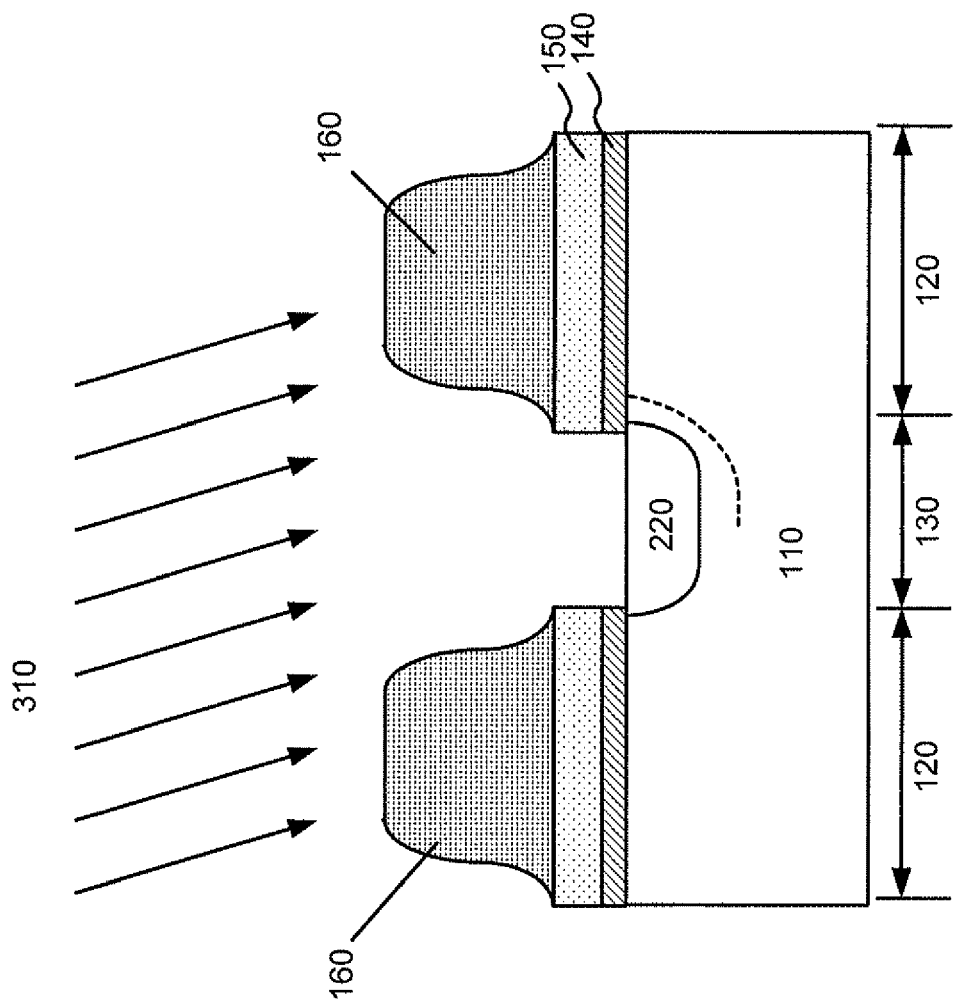
FIGS. 3A and 3B are cross-sections illustrating an ion implantation process used to form another portion of the bit line in accordance with an embodiment of the invention.
Figure 3B:
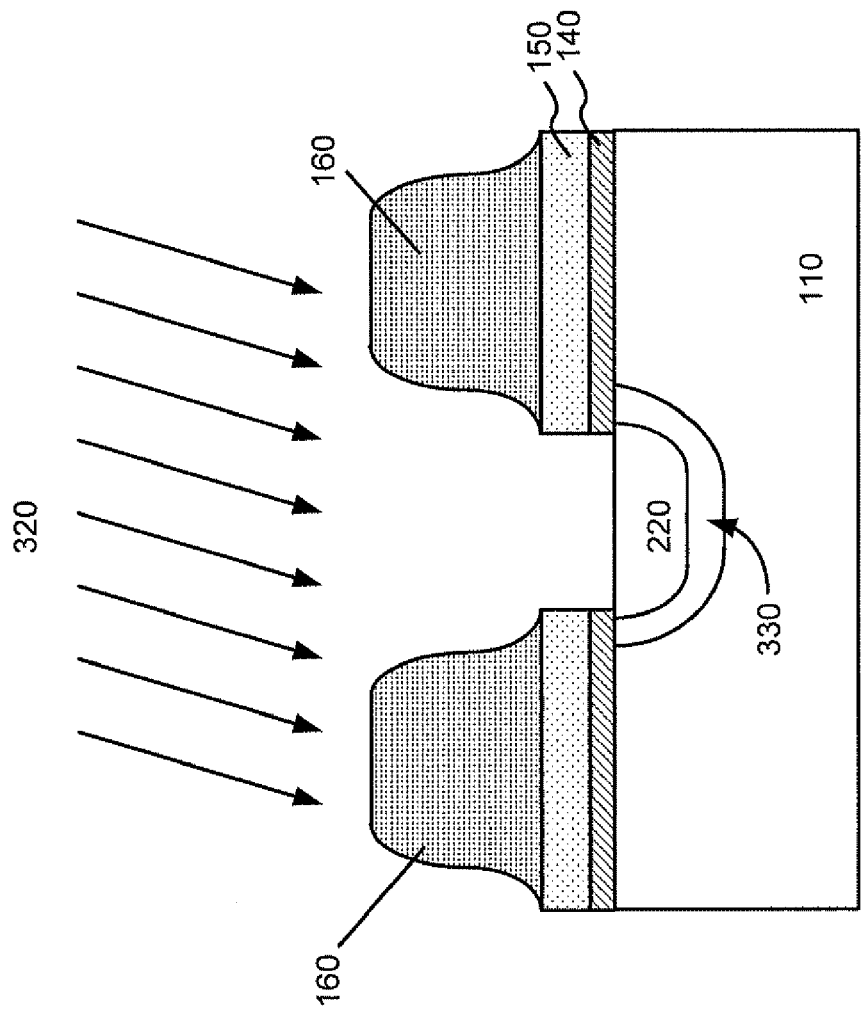

Another ion implantation process may then proceed as illustrated in FIG. 3B to complete the formation of a p-type region. For example, p-type impurities, such as boron, may be implanted in semiconductor device 100, as illustrated by arrows 320 in FIG. 3B. In an exemplary implementation, boron may be implanted at a similar dosage and implantation energy as the implantation discussed above with respect to FIG. 3A. The boron may also be implanted using a tilt angle ranging from about 10 degrees to about 20 degrees with respect to the upper surface of substrate 110, but in an opposite direction as the implantation illustrated in FIG. 3A.

The implantations illustrated in FIGS. 3A and 3B form p-type region 330, as illustrated in FIG. 3B. In an exemplary implementation, p-type region 330 may be formed to a depth ranging from about 300 Å to about 1000 Å below the upper surface of substrate 110 and a width ranging from about 1200 Å to about 2000 Å. In one implementation, p-type region 330 may range from about 100 Å to about 300 Å wider than n-type region 220 and the lower portion of p-type region 330 may be formed to a depth ranging from about 100 Å to about 800 Å below the lower portion of n-type region 220. P-type region 330 is advantageously wider and deeper than n-type region 220, as illustrated in FIG. 3. This wider and deeper p-type region 330 helps limit device roll-off and results in less device degradation associated with applying voltages to regions 220 and 330. For example, when the drain in a transistor gets closer to the source, the channel doping increases and the sub-threshold voltage (Vt) drops. This is typically referred to as Vt roll-off. By forming p-type region 330 in front of the n-type source and drain (i.e., wider and deeper than n-type region 220), the channel concentration remains constant even with shorter physical channel lengths. As a result, the sub-threshold voltage remains the same even with shorter channel lengths.

The particular implantation dosages and energy used to form regions 220 and 330 discussed above are exemplary only and the dosages and energies may be selected based on the particular end device requirements. One of ordinary skill in the art would be able to optimize the implantation process based on the particular circuit requirements. It should also be understood that regions 220 and 330 may alternatively be formed at other points in the fabrication process of semiconductor device 100. For example, regions 220 and 330 may be formed after memory cells have been formed, as described in more detail below. In such implementations, masks may be formed over the memory cells to shield the memory cells from the implantations used to form the bit lines. In addition, sidewall spacers may be formed prior to the ion implantations to control the location of the bit lines based on the particular circuit requirements. In other implementations, regions 220 and 330 may be formed prior to the deposition of layers 140 and 150.

In each case, it has been found that implanting the p-type impurities using a tilt angle of, for example, 10 degrees to 20 degrees, after the n-type impurities have been implanted using a vertical implantation, enables the formation of wide p-type regions 330 in addition to the formation of deep source/drain junctions. After regions 220 and 330 have been formed, an activation annealing may be performed to activate the n-type and p-type impurities in regions 220 and 330. After the annealing, masks 160 may be removed.

Figure 4:
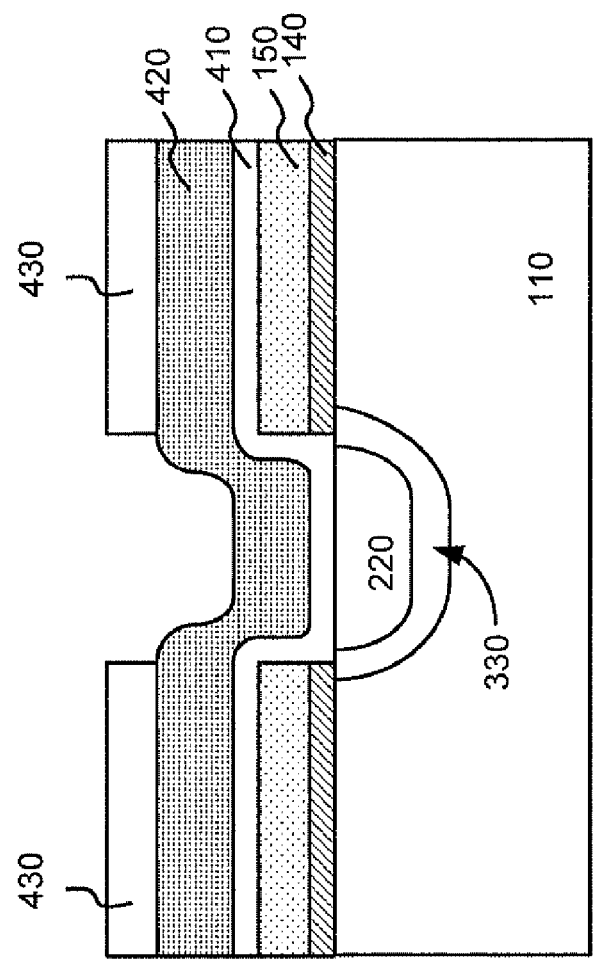
FIG. 4 is a cross-section illustrating the formation of exemplary layers used to form memory cells on the device of FIG. 3 in accordance with an embodiment of the invention.

One or more layers may then be formed on semiconductor device 100. For example, layers 410 and 420 may be formed on substrate 110, as illustrated in FIG. 4. Layer 410 may be formed on layer 150 and the exposed portion of substrate 110 in a conventional manner and may include a dielectric material, such as an oxide (e.g., $SiO_2$). Alternatively, layer 410 may include another material having a high dielectric constant (K), such as an aluminum oxide or a hafnium oxide, that may be deposited or thermally grown on layer 150 and substrate 110. In still other alternatives, layer 410 may be a composite that includes a number of dielectric layers or films. Layer 410 may have a thickness ranging from about 80 Å to about 120 Å and may function as an inter-gate dielectric for one or more memory cells in semiconductor device 100.

Layer 420 may include a conductive material, such as polycrystalline silicon, formed on layer 410 in a conventional manner. Alternatively, layer 420 may include other semiconducting materials, such as germanium or silicon-germanium, or various metals, such as titanium or tungsten. Layer 420, consistent with the invention, may be used to form one or more control gate electrodes for one or more memory cells in semiconductor device 100. In an exemplary implementation, layer 420 may have a thickness ranging from about 1800 Å to about 2500 Å.

A photoresist material may be patterned and etched to form masks 430 on the top surface of layer 420, as illustrated in FIG. 4. Mask 430 may be used to facilitate formation of one or more memory cells in semiconductor device 100, as described in more detail below.

Figure 5:
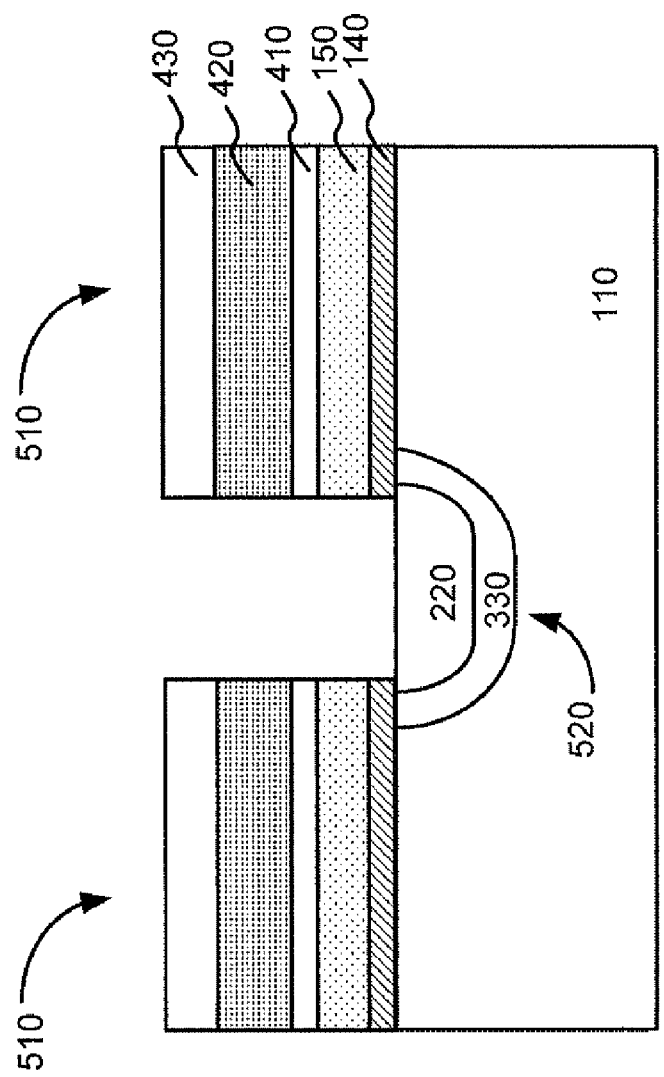
FIG. 5 is a cross-section illustrating the formation of memory cells in accordance with an embodiment of the invention.

Semiconductor device 100 may then be etched. Referring to FIG. 5, the portions of layers 410 and 420 not located under masks 430 may be etched in a conventional manner with the etching terminating at substrate 110 (i.e., n-type region 220), thereby forming structures 510. Structures 510 (also referred to herein as memory cells 510) may represent memory cells of semiconductor device 100, where each memory cell 510 includes a dielectric layer 140, a charge storage layer 150, an inter-gate dielectric layer 410 and a control gate electrode 420. Only two memory cells 510 are illustrated in semiconductor device 100 in FIG. 5 for simplicity. It should be understood that semiconductor device 100 may typically include a memory array including a large number of memory cells 510.

In an exemplary implementation consistent with the invention, memory cells 510 may be SONOS-type memory cells, with a silicon control gate electrode 420 formed on an oxide-nitride-oxide (ONO) stack (i.e., layers 410, 150 and 140), with nitride layer 150 acting as a charge storage layer, and the ONO stack being formed on a silicon substrate 110. In alternative implementations, memory cell 510 may be a floating gate memory cell, with a silicon control gate electrode 420, an inter-gate dielectric 410, a polysilicon floating gate electrode 150 and a tunnel oxide layer 140 formed on substrate 110.

In addition, n-type region 220 and p-type region 330 function as source and/or drain regions for memory cells 510. For example, n-type region 220 and p-type region 330 together form bit line 520, as illustrated in FIG. 5. Bit line 520 may function as a drain region for one memory cell 510 and a source region for an adjacent memory cell 510, where the source and drain regions of the adjacent memory cells 510 are coupled together. For example, bit line 520 may function as the drain region for the memory cell 510 located on the left side of FIG. 5 and the source region for the memory cell 510 located on the right side of FIG. 5, or vice versa. A similarly formed bit line (not shown) located adjacent the other sides of memory cells 510 may function as source and/or drain regions for the memory cells 510.

Figure 6:
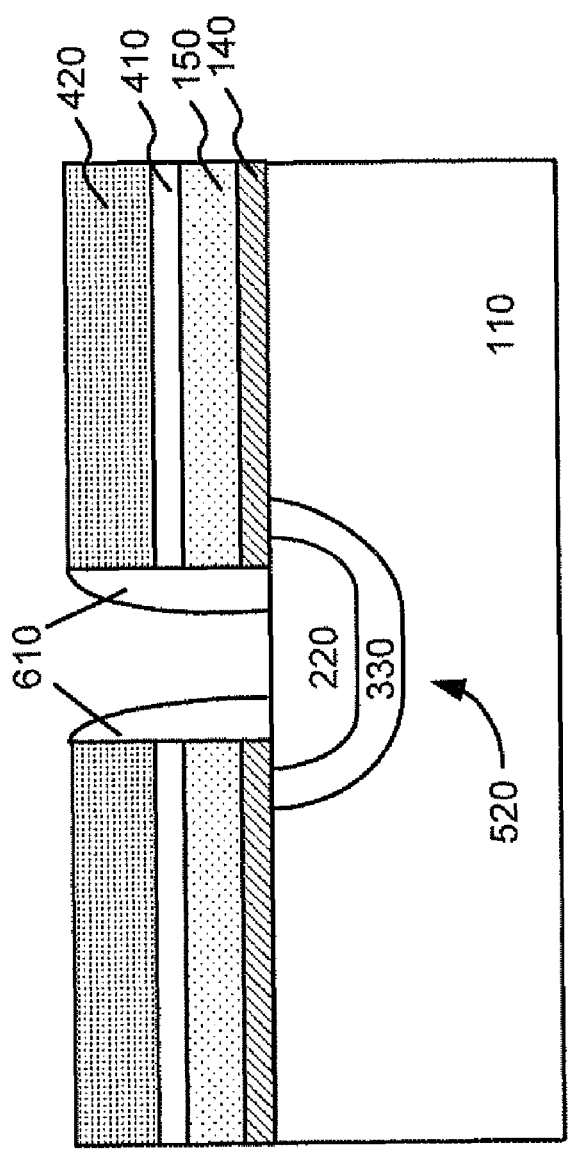
FIG. 6 is a cross-section illustrating the formation of spacers adjacent the sidewalls of memory cells of the semiconductor device of FIG. 5 in accordance with an embodiment of the invention.

Photoresist masks 430 may be removed using a conventional process. Spacers may be formed adjacent the sidewalls of the memory cells 510. For example, a dielectric material, such as a silicon oxide, a silicon oxynitride or another dielectric material, may be deposited and etched to form spacers 610 on each side of memory cells 510, as illustrated in FIG. 6. Spacers 610 may be used to electrically isolate one memory cell 510 from an adjacent memory cell 510. Spacers 610 may also be used to facilitate the deposition of additional impurities in semiconductor device 100.

In an exemplary implementation, a metal layer, such as cobalt or titanium, may be deposited over semiconductor device 100. In this implementation, semiconductor device 100 may then be annealed to react the deposited metal with the exposed silicon on semiconductor device 100 (e.g., over region 220 and/or layer 420) to form a metal-silicide compound (not shown).

Figure 7:
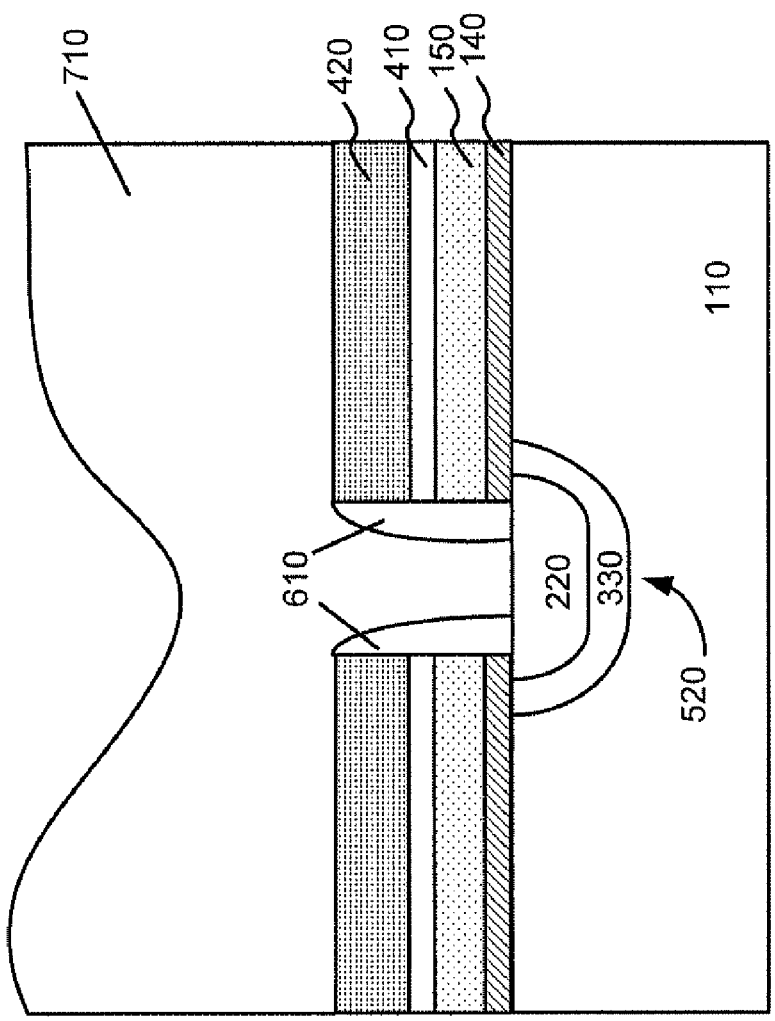
FIG. 7 is a cross-section illustrating the formation of an interlayer dielectric on the device of FIG. 6 in accordance with an embodiment of the invention.

An interlayer dielectric (ILD) 710 may be formed on semiconductor device 100, as illustrated in FIG. 7. In an exemplary implementation, ILD layer 710 may include an oxide, such as silicon dioxide, a phosphosilicate glass (PSG), a boro-phosphosilicate glass (BPSG), etc.

Figure 8:
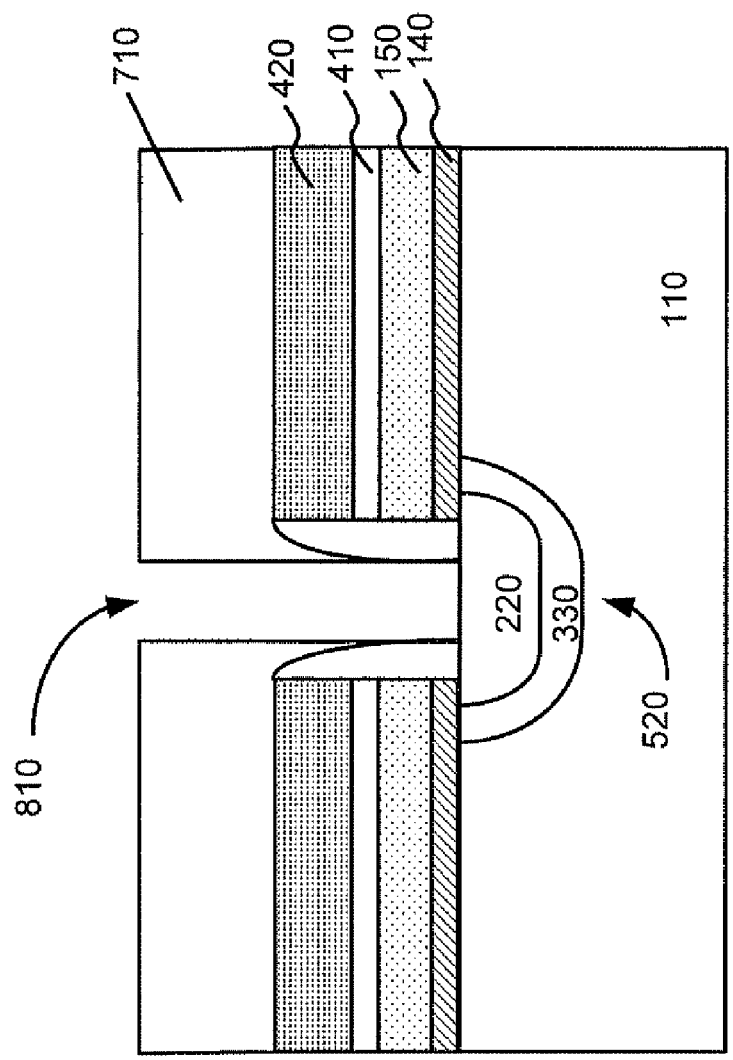
FIG. 8 is a cross-section illustrating the planarization of the interlayer dielectric and the formation of a trench in the interlayer dielectric of FIG. 7 in accordance with an embodiment of the invention.

ILD 710 may optionally be planarized using a conventional process, such as a chemical-mechanical polishing (CMP) process, as illustrated in FIG. 8. Referring to FIG. 8, the CMP process may planarize the top surface of ILD 710 to facilitate formation of subsequent structures, such as interconnect lines. ILD 710, consistent with the invention, may represent an ILD located closest to substrate 110 and may function to electrically isolate various conductive structures, such as various interconnect lines (not shown) from other conductive structures.

Figure 9:
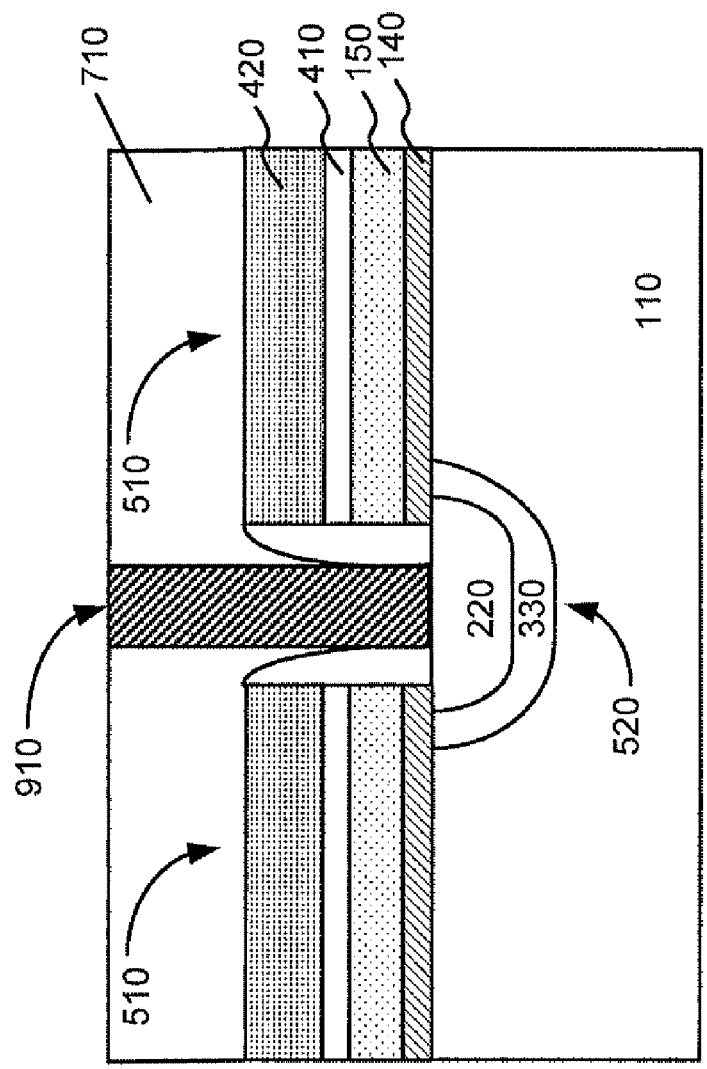
FIG. 9 is a cross-section illustrating the formation of a contact to the bit line of FIG. 8 in accordance with an embodiment of the invention.

For example, a trench 810 may be formed in ILD 710, as illustrated in FIG. 8, using a conventional photolithographic and etching technique. Trench 810 may be used to form a contact to bit line 520. Next, a metal layer, such as copper, aluminum or tungsten, may be deposited to fill trench 810 and form contact 910, as illustrated in FIG. 9. Contact 910 may represent a bit line contact. An interconnect line (not shown) may then be formed over the planarized top surface of ILD 710 in FIG. 9. For example, a metal, such as copper, aluminum or tungsten, may be deposited to form an interconnect that connects various features in semiconductor device 100, such as bit line contact 910 to an external electrode, to facilitate programming or erasing various memory cells 510 in semiconductor device 100. For example, bit line 520 may represent a bit line for a number of memory cells 510, such as a column of memory cells in a memory cell array included in semiconductor device 100. In this case, bit line contact 910 may be coupled to an external electrode to supply voltage to bit line 520.

In an exemplary implementation consistent with the invention, each of memory cells 510 illustrated in FIG. 9 may be configured to store two or more bits of data. For example, charge storage layer 150 for each memory cell 510 may be programmed to store two separate bits of data by localizing the first and second charges to the respective left and right sides of charge storage layer 150 for each memory cell 510 illustrated in FIG. 9. Each of the two bits for each of memory cells 510 may be programmed independently by, for example, channel hot electron injection, to store a bit on each respective side of the charge storage layer 150. In this manner, the charges in charge storage layer 150 become effectively trapped on each respective side of charge storage layer 150. Erasing of each bit in memory cell 510 may also be performed independently. During erasing, the bits stored in charge storage layer 150 may tunnel through dielectric layer 140 into the source region and drain region, respectively (e.g., bit line 520). In alternative implementations, the charge storage layer 150 for each of memory cells 510 may be configured to store charges representing three or more bits of data by localizing the charges in charge storage layer 150.

In this manner, the density of the resulting memory array in semiconductor device 100 may be increased as compared to conventional memory devices that store only one bit of data per cell. In an alternative implementation, each memory cell 510 may be configured to store one bit of data per memory cell 510.

In summary, implementations consistent with the invention form bit lines having an n-type region and a p-type region. Advantageously, the memory cells in semiconductor device 100 may exhibit increased reliability.

In the previous descriptions, numerous specific details are set forth, such as specific materials, structures, chemicals, processes, etc., in order to provide a thorough understanding of the invention. However, implementations consistent with principles of the invention can be practiced without resorting to the details specifically set forth herein. In other instances, well known processing structures have not been described in detail, in order not to unnecessarily obscure the thrust of the invention.

For example, the dielectric and conductive layers used in manufacturing a semiconductor device in accordance with the invention can be deposited by conventional deposition techniques. For example, various types of chemical vapor deposition (CVD) processes, including low pressure chemical vapor deposition (LPCVD) and enhanced chemical vapor deposition (ECVD) can be employed. In addition, conventional electroplating, photolithographic and etching techniques may also be employed, and hence, the details of such techniques have not been set forth herein in detail.

Implementations of the invention are applicable in the manufacturing of semiconductor devices and particularly in memory devices having small design features and high circuit density. The invention is applicable to the formation of any of various types of semiconductor devices, and hence, details have not been set forth in order to avoid obscuring the thrust of the invention.

In addition, no element, act or process used in the description of the invention should be construed as critical or essential to the invention unless explicitly described as such. Also, as used herein, the article "a" is intended to include one or more items. Where only one item is intended, the term "one" or similar language is used.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

The invention claimed is:

1. A method for forming a semiconductor device, the method comprising:
    forming a first dielectric layer over a first portion of a substrate;
    forming a charge storage layer over the first dielectric layer;
    forming masks over portions of the first dielectric layer and the charge storage layer;
    etching a trench in the charge storage layer and the first dielectric layer, the trench extending to the substrate, where the masks prevent removal of portions of the first dielectric layer and the charge storage layer during etching of the trench;
    after etching the trench, implanting n-type impurities into the substrate to form an n-type region having a first depth and a first width ranging from about 1100 Å to about 1700 Å, where implanting the n-type impurities includes removing a portion of the masks to cause the first width of the n-type region to be greater than a width of the trench;
    implanting p-type impurities into the substrate after implanting the n-type impurities, the p-type impurities forming a p-type region having a second depth and a second width ranging from about 1200 Å to about 2000 Å, where the second depth is greater than the first depth and the second width is greater than the first width;
    forming a second dielectric layer over the charge storage layer, the second dielectric layer filling a portion of the trench; and
    forming a control gate over the second dielectric layer.

2. The method of claim 1, where implanting the n-type impurities comprises performing a vertical implantation having no tilt angle; and
    where implanting the p-type impurities comprises implanting the p-type impurities using a tilt angle ranging from about 10 degrees to 20 degrees.

3. The method of claim 2, where implanting the p-type impurities comprises:
    performing a first implantation to form a first portion of the p-type region, and
    performing a second implantation to form a remaining portion of the p-type region.

4. The method of claim 1, where the first depth ranges from 200 Å to 400 Å below an upper surface of the substrate and the second depth ranges from 300 Å to 1000 Å below the upper surface of the substrate.

5. The method of claim 1, where the n-type impurities are implanted using a higher energy implantation than the p-type impurities.

6. The method of claim 1, where implanting the n-type impurities comprises implanting n-type impurities at a first implantation dosage and implanting the p-type impurities comprises implanting p-type impurities at a second implantation dosage, the first implantation dosage being greater than the second implantation dosage.

7. The method of claim 1, where forming the second dielectric layer comprises:
    forming a high dielectric constant layer comprising aluminum or hafnium.

8. The method of claim 1, where forming the charge storage layer comprises:
    depositing a nitride layer.

9. A method, comprising:
    forming a first dielectric layer over a first portion of a substrate;
    forming a charge storage layer over the first dielectric layer;
    forming masks over portions of the first dielectric layer and the charge storage layer;
    etching a trench through the charge storage layer and the first dielectric layer to the substrate, where the masks prevent removal of portions of the first dielectric layer and the charge storage layer during etching of the trench;
    after etching the trench, implanting n-type impurities into the substrate to form an n-type region having a first depth and a first width, where implanting the n-type impurities includes removing a portion of the masks to cause the first width of the n-type region to be greater than a width of the trench;
    implanting p-type impurities into the substrate after implanting the n-type impurities, the p-type impurities forming a p-type region having a second depth and a second width, where the second depth ranges from about 100 Å to about 800 Å more than the first depth, and where the second width ranges from about 100 Å to about 200 Å more than the first width;
    forming a second dielectric layer over the charge storage layer; and
    forming a control gate over the second dielectric layer.

10. The method of claim 9,
    where implanting the n-type impurities comprises performing an implantation having substantially no tilt angle; and
    where implanting the p-type impurities comprises:
        performing a first implantation at a first tilt angle to form a first portion of the p-type region, and
        performing a second implantation at a second tilt angle to form a remaining portion of the p-type region.

11. The method of claim 1, where the second width ranges from about 100 Å to 300 Å greater than the first width.

12. The method of claim 1, where a lower portion of the p-type region is formed at a depth ranging from about 100 Å to about 800 Å below a lower portion of the n-type region.

13. The method of claim 9, where the first depth ranges from about 200 Å to about 400 Å below an upper surface of the substrate, the first width ranges from about 1100 Å to about 1700 Å, the second depth ranges from about 300 Å to about 1000 Å below the upper surface of the substrate, and the second width ranges from about 1200 Å to about 2000 Å.

14. The method of claim 9, where the n-type impurities are implanted using a higher energy implantation and a higher dosage concentration than the p-type impurities.

15. The method of claim 9, where forming the second dielectric layer comprises:
    forming a high dielectric constant layer comprising aluminum or hafnium.

16. The method of claim 9, where forming the charge storage layer comprises:
    depositing a nitride layer.

* * * * *